US012805262B2

(12) United States Patent
Mustafa et al.

(10) Patent No.: US 12,805,262 B2
(45) Date of Patent: Nov. 17, 2026

(54) HEATER PEDESTAL WITH IMPROVED UNIFORMITY

(71) Applicant: Applied Materials, Inc., Santa Clara, CA (US)

(72) Inventors: Muhannad Mustafa, Milpitas, CA (US); Yongjing Lin, San Jose, CA (US); Satish Radhakrishnan, San Jose, CA (US); Haoyan Sha, San Jose, CA (US); Shih Chung Chen, Cupertino, CA (US); Mario D. Silvetti, Fountain Hills, AZ (US); Mandyam Sriram, San Jose, CA (US); Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 985 days.

(21) Appl. No.: 17/497,881

(22) Filed: Oct. 8, 2021

(65) Prior Publication Data

US 2022/0367236 A1 Nov. 17, 2022

Related U.S. Application Data

(60) Provisional application No. 63/189,203, filed on May 16, 2021.

(51) Int. Cl.
*H10P 72/76* (2026.01)
*C23C 16/455* (2006.01)
(Continued)

(52) U.S. Cl.
CPC .... *H10P 72/7614* (2026.01); *C23C 16/45521* (2013.01); *C23C 16/4583* (2013.01);
(Continued)

(58) Field of Classification Search
CPC .......... H01L 21/6875; H01L 21/67103; H01L 21/67109; H01L 21/6838; H01L 21/68735;
(Continued)

(56) References Cited

U.S. PATENT DOCUMENTS

| | | | |
|---|---|---|---|
| 5,230,741 | A | 7/1993 | Van De Ven et al. |
| 5,556,476 | A | 9/1996 | Lei et al. |

(Continued)

FOREIGN PATENT DOCUMENTS

| | | |
|---|---|---|
| JP | H11330219 A | 11/1999 |
| JP | 2002506279 A | 2/2002 |

(Continued)

OTHER PUBLICATIONS

PCT International Search Report and Written Opinion in PCT/US2022/029201 dated Sep. 7, 2022, 14 pages.

*Primary Examiner* — Erwin J Wunderlich
(74) *Attorney, Agent, or Firm* — Servilla Whitney LLC

(57) ABSTRACT

Some embodiments of the disclosure relate to methods of modifying a heater pedestal to improve temperature and thickness uniformity. Some embodiments of the disclosure relate to the modified heater pedestals with improved temperature and thickness uniformity. In some embodiments, the height of support mesas in different regions of the pedestal are modified to increase temperature uniformity. In some embodiments, the heater elements are moved above the vacuum channel and purge channel to increase temperature uniformity. In some embodiments, the edge ring is modified to be coplanar with the top of a supported substrate.

11 Claims, 7 Drawing Sheets

(51) Int. Cl.

| | |
|---|---|
| ***C23C 16/458*** | (2006.01) |
| ***C23C 16/46*** | (2006.01) |
| ***H10P 72/00*** | (2026.01) |
| ***H10P 72/78*** | (2026.01) |

(52) U.S. Cl.
CPC ...... *C23C 16/4585* (2013.01); *C23C 16/4586* (2013.01); *C23C 16/46* (2013.01); *H10P 72/0431* (2026.01); *H10P 72/0432* (2026.01); *H10P 72/0434* (2026.01); *H10P 72/7611* (2026.01); *H10P 72/78* (2026.01); *H10P 72/7606* (2026.01)

(58) Field of Classification Search
CPC ......... H01L 21/67098; H01L 21/68721; C23C 16/45521; C23C 16/4583; C23C 16/4585; C23C 16/4586; C23C 16/46
See application file for complete search history.

(56) References Cited

U.S. PATENT DOCUMENTS

| | | | | |
|---|---|---|---|---|
| 5,888,304 | A * | 3/1999 | Umotoy | C23C 16/4585 118/728 |
| 6,159,299 | A | 12/2000 | Koai et al. | |
| 6,223,447 | B1 * | 5/2001 | Yudovsky | H01L 21/68735 118/728 |
| 6,413,321 | B1 * | 7/2002 | Kim | C23C 16/0209 438/758 |
| 6,475,336 | B1 * | 11/2002 | Hubacek | C23C 16/4585 156/345.47 |
| 6,494,955 | B1 | 12/2002 | Lei et al. | |
| 6,753,255 | B1 * | 6/2004 | Takada | H01L 21/67017 438/758 |
| 2001/0042594 | A1 | 11/2001 | Shamouilian et al. | |
| 2003/0136520 | A1 * | 7/2003 | Yudovsky | C23C 16/4586 118/723 E |
| 2006/0075969 | A1 | 4/2006 | Fischer | |
| 2007/0151517 | A1 * | 7/2007 | Baik | C23C 16/46 118/725 |
| 2008/0152838 | A1 * | 6/2008 | Sen | C23C 16/45521 427/569 |
| 2012/0285619 | A1 | 11/2012 | Matyushkin et al. | |
| 2014/0319676 | A1 * | 10/2014 | Matsuo | H01J 37/3452 257/734 |
| 2015/0044947 | A1 * | 2/2015 | Lu | B24B 37/32 451/41 |
| 2016/0002778 | A1 * | 1/2016 | Ravi | H01L 21/6838 118/728 |
| 2016/0135252 | A1 | 5/2016 | Matyushkin et al. | |
| 2016/0192444 | A1 * | 6/2016 | Matsushita | H01L 21/67103 219/539 |
| 2017/0140970 | A1 | 5/2017 | Boyd, Jr. et al. | |
| 2017/0278737 | A1 * | 9/2017 | Koiwa | H01L 21/6833 |
| 2017/0352575 | A1 * | 12/2017 | Gangakhedkar | H01L 21/68764 |
| 2018/0103508 | A1 | 4/2018 | Matyushkin et al. | |
| 2018/0148835 | A1 * | 5/2018 | Erickson | C23C 16/463 |
| 2018/0337074 | A1 * | 11/2018 | Samir | H01L 21/68735 |
| 2020/0234932 | A1 * | 7/2020 | Parimi | H01J 37/32715 |
| 2020/0303230 | A1 * | 9/2020 | Sonoda | H01L 21/6831 |
| 2021/0005494 | A1 * | 1/2021 | Matyushkin | H01L 21/67109 |
| 2023/0010049 | A1 * | 1/2023 | Vellanki | H01L 21/68757 |

FOREIGN PATENT DOCUMENTS

| | | | |
|---|---|---|---|
| JP | 2008182228 | A | 8/2008 |
| JP | 2018022880 | A | 2/2018 |
| JP | 2019220496 | A | 12/2019 |
| JP | 2021015926 | A | 2/2021 |

* cited by examiner

HEATER PEDESTAL WITH IMPROVED UNIFORMITY

CROSS-REFERENCE TO RELATED APPLICATIONS

This application claims priority to U.S. Provisional Application No. 63/189,203, filed May 16, 2021, the entire disclosure of which is hereby incorporated by reference herein.

TECHNICAL FIELD

Embodiments of the disclosure generally relate to methods for improving temperature uniformity across a wafer on a heater pedestal. In particular, embodiments of the disclosure relate to methods of modifying the physical dimensions and arrangement of elements to improve temperature uniformity.

BACKGROUND

Semiconductor processing chambers typically contain a pedestal suspended in the chamber for supporting the wafer or substrate to be processed. In many embodiments, the pedestal also contains a heater for maintaining the substrate at an elevated temperature during processing.

The pedestals also contain several gas channels to aid in processing the substrate. For example, in some cases, the pedestals contain a vacuum channel which is used to provide a vacuum to secure the substrate to the pedestal. Another example is an edge purge channel which provides a flow of purge gas to the region near the peripheral edge of the substrate to avoid unwanted deposition.

Unfortunately, both of these gas channels can lower the substrate temperature immediately surrounding the channels. This temperature variation or "non-uniformity" (N/U) can affect the reaction rate of the process occurring on the substrate surface during processing, resulting in a variation in thickness across the substrate surface (i.e., thickness non-uniformity).

Accordingly, there is a need for improved heater pedestals which provide better temperature uniformity. Also, there is a need for modifying existing heater pedestals to provide better temperature uniformity.

SUMMARY

One or more embodiments of the disclosure are directed to a method of modifying a heater pedestal to decrease temperature non-uniformity across a substrate supported on the heater pedestal. The method comprises modifying the height of mesas within one or more concentric regions of the heater pedestal, modifying the number of mesas on the heater pedestal, modifying a depth of a chucking channel securing the substrate to the heater pedestal, modifying the composition of an edge ring surrounding the substrate, or modifying the height of the edge ring.

Additional embodiments of the disclosure are directed to a method of modifying a heater pedestal to decrease temperature non-uniformity across a substrate supported on the heater pedestal. The method comprises moving a heater plate containing one or more heater coils above a lower top plate containing an edge purge channel and a vacuum chucking channel, modifying an orientation of an edge purge gas flow relative to an edge of the heater plate, or modifying a thickness of the heater pedestal to increase a flow path distance of the edge purge gas flow proximate to the heater plate.

Further embodiments of the disclosure are directed to a heater pedestal for supporting a substrate during processing. The pedestal comprises a base plate comprising an edge purge channel extending from near the center of the pedestal towards the peripheral edge of the pedestal, and a vacuum channel extending from near the center of the pedestal towards a plurality of outlets. A heater plate is on the base plate. The heater plate comprises two concentric heaters: a first heater covering the center of the pedestal to a radius of about 135 mm, and a second heater covering from a radius of about 135 mm to the peripheral edge of the pedestal. A top plate is on the heater plate. The top plate comprises a plurality of top outlets and a plurality of substrate support mesas in the top surface of the top plate. The top outlets provide a fluid connection to the outlets through the heater plate and the top plate. An edge ring surrounds the periphery of the base plate, the heater plate, the top plate, and, if present, the substrate.

BRIEF DESCRIPTION OF THE DRAWINGS

So that the features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
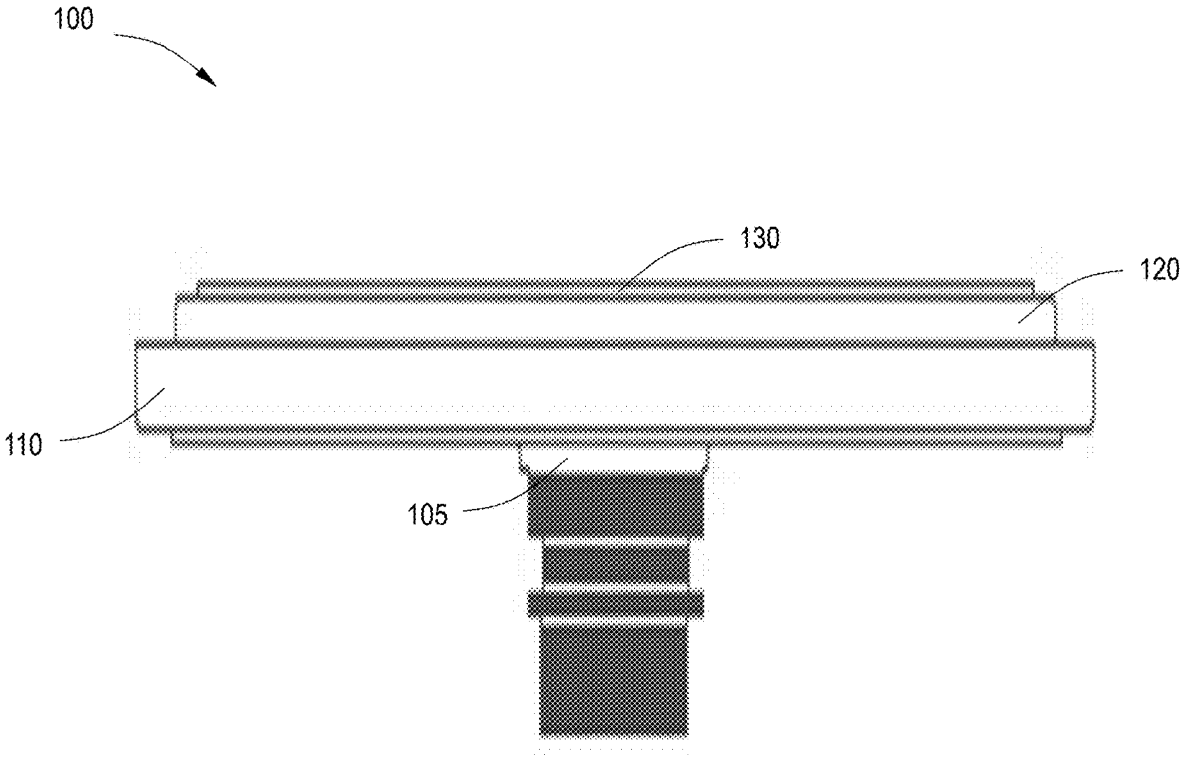
FIG. 1 is a side view of a heater pedestal according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

One or more embodiments of the disclosure are directed to a pedestal heater. Some embodiments of the disclosure advantageously provide lower temperature non-uniformity across a supported wafer during processing. Some embodiments of the disclosure advantageously provide lower thickness non-uniformity of a deposited film across a supported wafer during processing. Some embodiments of the disclosure advantageously reduce the temperature signature of a chucking channel on a supported wafer during processing.

For the purposes of the disclosure, reference will be made to variability plots and the values derived therefrom. Variability plots measure a substrate across the entire substrate surface. In some embodiments, the variability plots measure 49 points or 73 points on the substrate surface. In some embodiments, the variability plots measure the temperature of the substrate. In some embodiments, the variability plots measure the thickness of a deposited film.

In some embodiments, the deposited film is a TiAl film deposited by atomic layer deposition at a substrate temperature of about 350° C.

Throughout the disclosure reference will be made to a measure of non-uniformity referred to as 3-sigma. A 3-sigma value denotes the percentage of measured points which fall outside of 3 standard deviations from the mean. Accordingly, a lower 3-sigma value corresponds to higher uniformity and lower non-uniformity.

Referring to FIGS. 1-4, one or more embodiment is directed to a heater pedestal 100. In some embodiments, the heater pedestal 100 comprises a shaft 105 connected to a base plate 110. A heater plate 120 is positioned on the base plate 110. A top plate 130 is positioned on the heater plate 120 While each of the shaft 105, base plate 110, heater plate 120 and top plate 130 are shown to be separate in FIG. 1, one skilled in the art should understand that these elements may be formed of the same material, and one or more of these elements may be integrally formed together.

The shaft 105 provides a conduit for gas flows (e.g., purge, vacuum), electrical connections (e.g., heater power, metrology sensors, etc.), and mechanical connections (e.g., motor connections, structural support).

The base plate 110 is connected to the shaft 105 and provides structural support for the heater plate 120 and the top plate 130. The heater plate 120 comprises one or more heater to maintain a supported substrate at a fixed temperature during processing. Due to numerous factors, the temperature across the surface of the substrate may vary or have some degree of non-uniformity.

In some embodiments, the heater plate 120 comprises more than one heating element. In some embodiments, the more than one heating element are arranged concentrically so that one or more heater operates primarily on an inner region of the substrate while an additional one or more heater operates on an outer or peripheral region of the substrate. In some embodiments, the heater plate 120 contains two heating elements. In some embodiments, a first heating zone is heated by heater 630 and covers up to a radius of 135 mm, while a second heating zone is heated by heater 640 and covers a radius of 135 mm to the outer peripheral edge of the heater plate 120. In some embodiments, the heater plate 120 has a radius of 152 mm.

The top plate 130 is positioned on the heater plate 120 and provides support for the substrate during processing. In some embodiments, the top plate 130 has a radius of about 150 mm.

Figure 2:
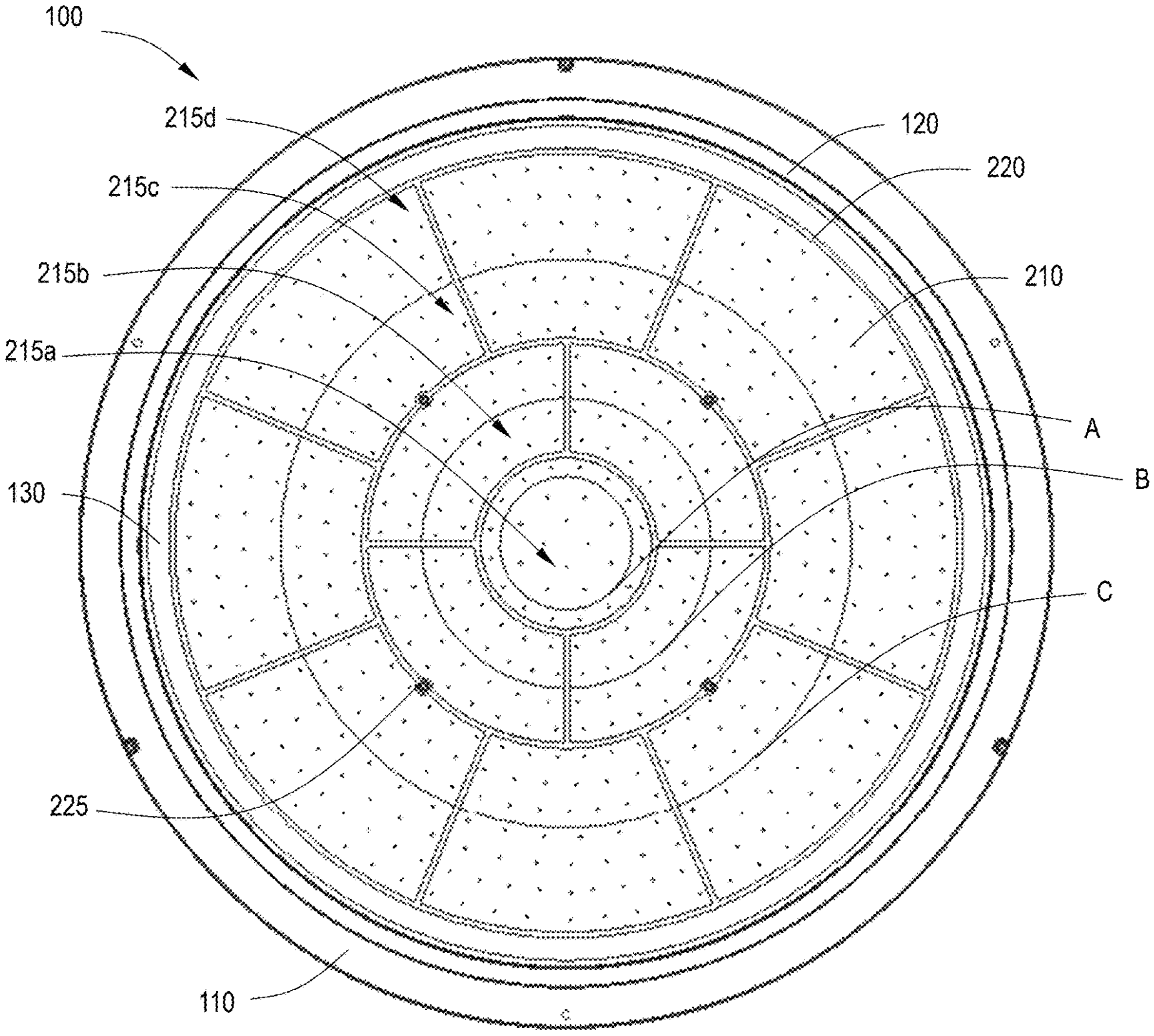
FIG. 2 is a top view of a heater pedestal according to one or more embodiments of the disclosure.
Figure 3:
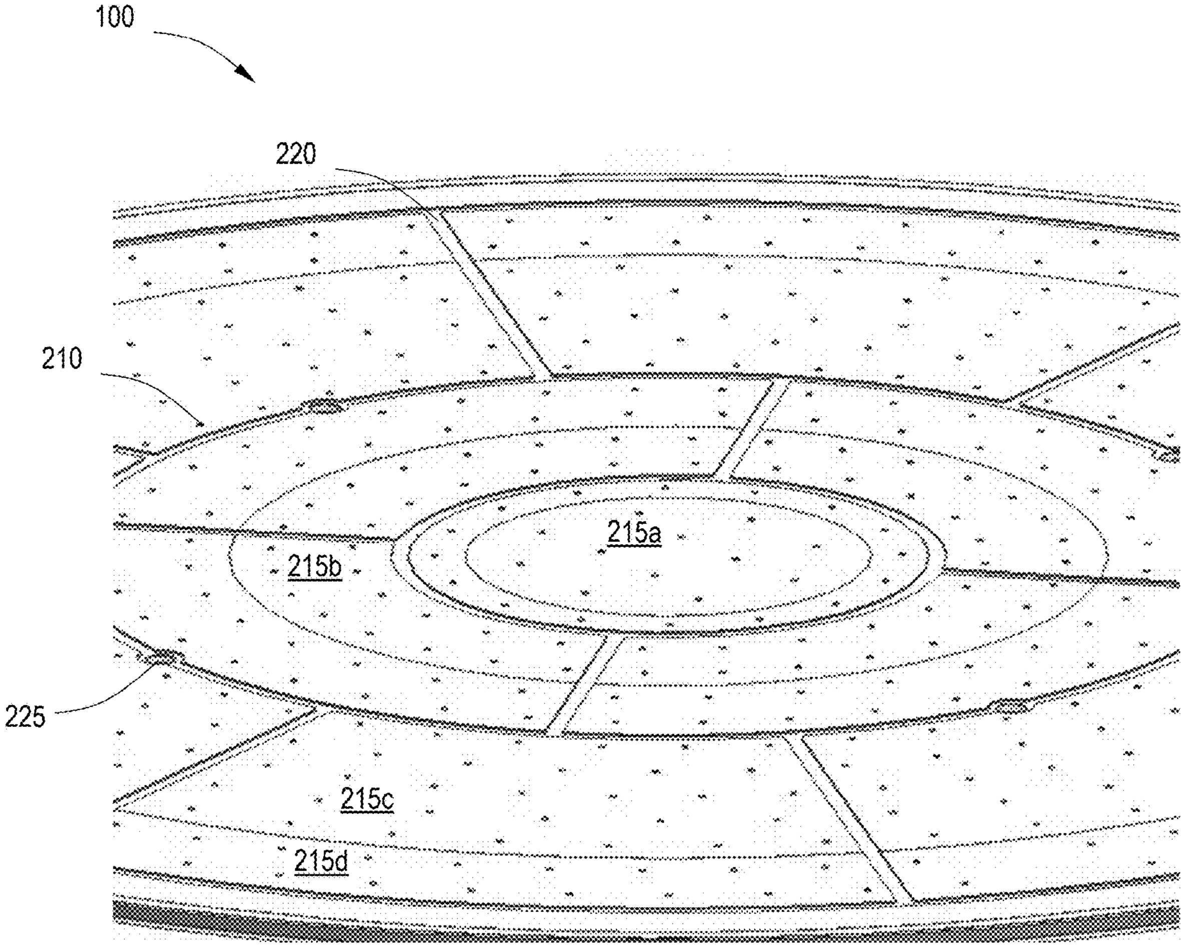
FIG. 3 is an enlarged perspective view of the top of a heater pedestal according to one or more embodiments of the disclosure.

As shown in FIGS. 2 and 3, the substrate is supported by a plurality of mesas 210. In some embodiments, the top plate comprises in a range of about 500 to about 650 mesas. In some embodiments, the mesas are circular in shape with a radius of about 30 mils. In some embodiments, the mesas have a height in a range of about 2 mil to about 4 mil.

For the purposes of this disclosure, the mesas 210 can be identified as being within concentric zones 215*a*-215*d*. Zone 215*a* is the region bounded by line A. Zone 215*b* is region between line A and line B. Zone 215*c* is the region between line B and line C. Zone 215*d* is the region between line C and the periphery of the top plate 130.

While four zones are shown in FIGS. 2 and 3, this disclosure may admit to a larger or smaller number of zones. In some embodiments, line A is positioned at a radius of about 25 mm. In some embodiments, line B is positioned at a radius of about 50 mm. In some embodiments, line C is positioned at a radius of about 100 mm.

Also shown in FIGS. 2 and 3 is a chucking channel 220. Chucking channel 220 is in fluid communication with at least one outlet 225 from a vacuum channel 430 (shown in FIG. 4). As shown in FIG. 3, the chucking channel 220 is recessed and has a depth in a range of 10 mils to 20 mil. Chucking channel 220 provides backside negative pressure to the substrate to ensure that the substrate does not move on the heater pedestal 100.

Figure 4:
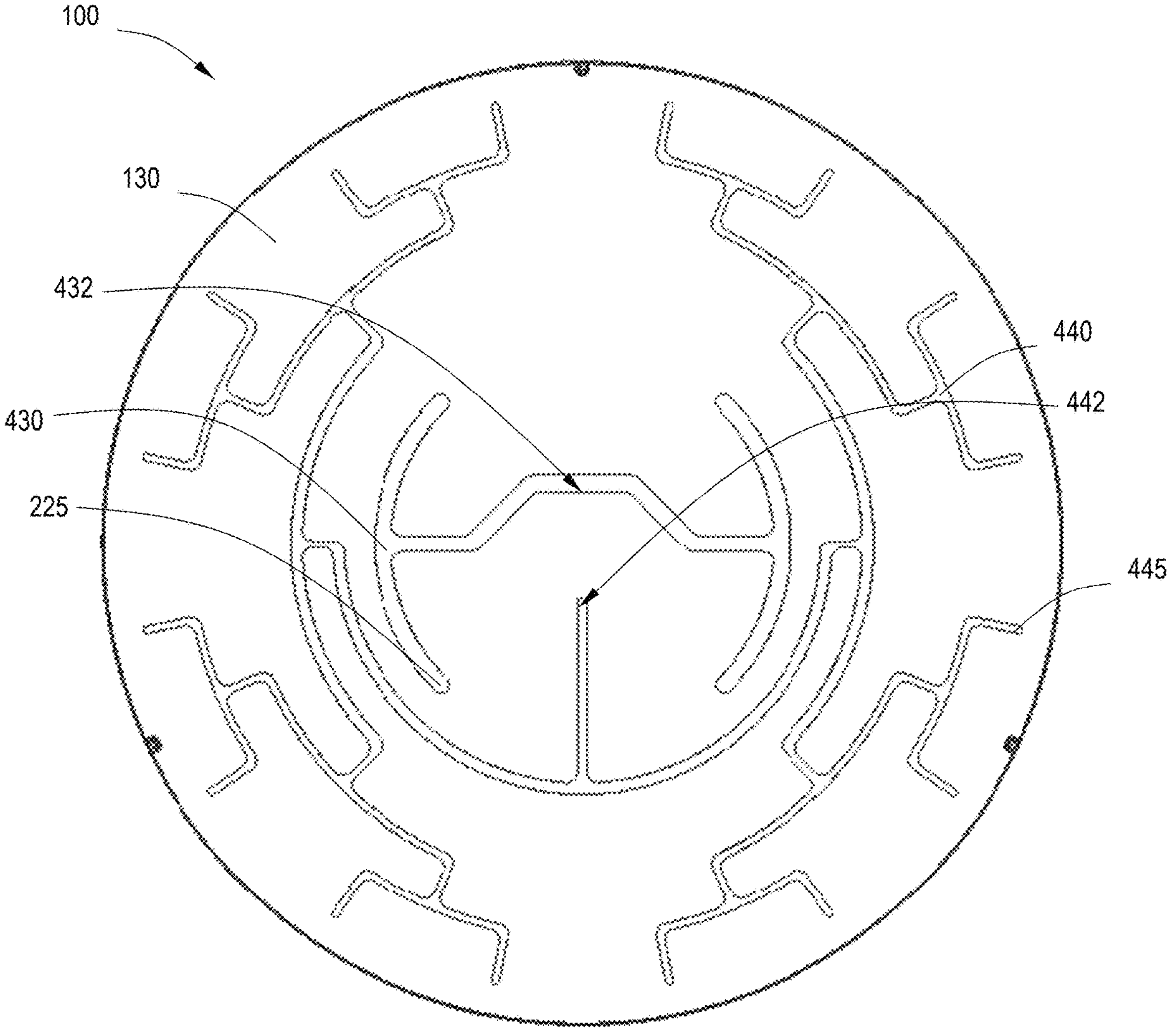
FIG. 4 is a top view of interior channels within a heater pedestal according to one or more embodiments of the disclosure.

Referring to FIG. 4, the top plate 130 also contains a vacuum channel 430 and an edge purge channel 440 within the top plate 130. Both the vacuum channel 430 and the edge purge channel 440 begin near the center of the top plate 130. As shown in FIG. 4, the vacuum channel 430 begins at 432 and continues to four outlets 225. The edge purge channel 440 begins at 442 and continues to sixteen top outlets 445. While four outlets 225 and sixteen top outlets 445 are shown in FIG. 4, any number of suitable outlets are envisioned as part of this disclosure.

Without being bound by theory, it is believed that the gas flows through vacuum channel 430 and edge purge channel 440 to lower the local temperature of a substrate positioned above these channels by reducing the thermal conductance of the pedestal. For the heater pedestal design shown in FIGS. 1-4, the outer radius of the vacuum channel 430, at a radius of about 75 mm, shows the most significant temperature non-uniformity (see FIGS. 5A and 5B). Accordingly, there is an increased temperature non-uniformity when these channels are in use.

As a result of this temperature non-uniformity, the inventors have discovered multiple methods for modifying a heater pedestal 100 to decrease the temperature non-uniformity across a substrate supported on the heater pedestal 100.

In some embodiments, the methods comprise increasing the relative thermal conductance of the pedestal above the vacuum channel 430 to counteract any loss of conductance as a result of the channel. In some embodiments, the methods comprise decreasing the thermal conductance of the pedestal which is not above the vacuum channel 430 to provide a more uniform thermal conductance across the pedestal.

In some embodiments, the methods comprise modifying the height of the mesas within one or more of the regions. In some embodiments, the height of the mesas is increased in one or more of the regions. In some embodiments, the height of the mesas is increased by up to 200%. In some embodiments, the height of the mesas 210 within zone 215*a* may be increased by 100%, the height of mesas 210 within zone 215*b* increased by 50%, the height of mesas 210 in zone 215*c* increased by 0%, and the height of mesas 210 within zone 215*d* increased by 50%. In some embodiments, the height of the mesas 210 within zone 215*a* may be increased by 2 mil, the height of mesas 210 within zone 215*b* increased by 1 mil, the height of mesas 210 in zone 215*c* increased by 0 mil, and the height of mesas 210 within zone 215*d* increased by 1 mil.

In some embodiments, the methods comprise reducing the number of mesas 210 on the heater pedestal 100. In some embodiments, the outermost ring of mesas 210 is removed. In some embodiments, the number of mesas is reduced by greater than or equal to 15%. In some embodiments, the number of mesas is reduced from 622 to 528.

In some embodiments, the methods comprise modifying the depth of the chucking channel 220. In some embodiments, the depth of the chucking channel is decreased. In some embodiments, the depth of the chucking channel is decreased by greater than or equal to 25%. In some embodiments, the depth of the chucking channel is decreased from about 15 mil to about 11 mil.

The inventors have surprisingly found that by implementing one or more of the disclosed methods, the temperature non-uniformity (3-sigma) can be reduced by greater than or equal to 40%. For example, a heater pedestal without modification provides a 3-sigma value of about 3%, but a heater pedestal modified by the disclosed methods provides a 3-sigma value of about 1.8% for temperature non-uniformity.

Figure 5A:
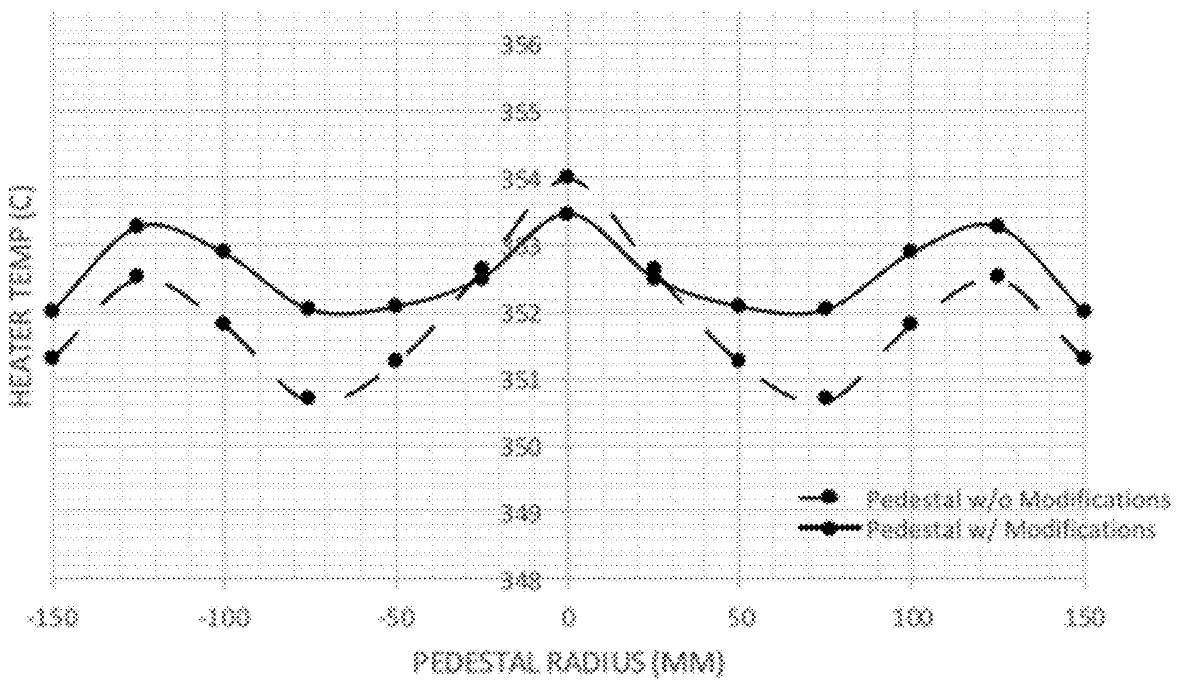
FIGS. 5A and 5B illustrate simulated temperature and deposition thickness profiles before and after modification according to one or more embodiments of the disclosure.
Figure 5B:
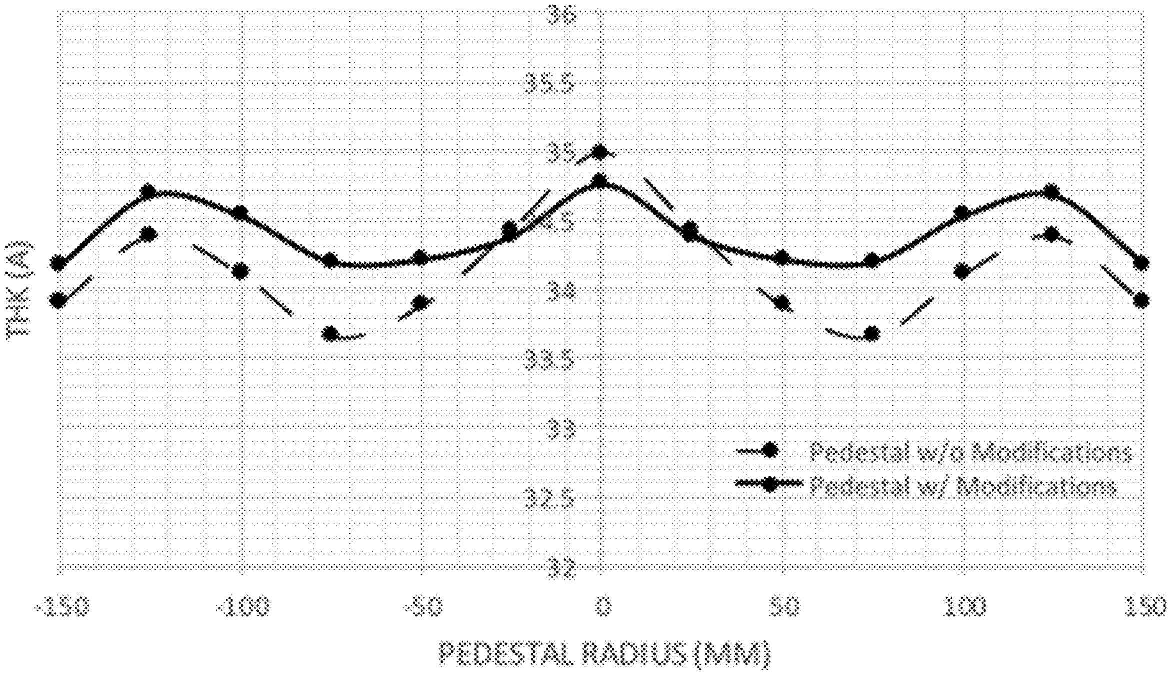

Similarly, the inventors have also surprisingly found that by implementing one or more of the disclosed methods, the thickness non-uniformity (3-sigma) of a film deposited on the substrate can be reduced by greater than or equal to 50%. For example, a heater pedestal without modification provides a 3-sigma value of about 3%, but a heater pedestal modified by the disclosed methods provides a 3-sigma value of about 1.5% for thickness non-uniformity. FIGS. 5A and 5B illustrate simulated temperature and deposition thickness profiles before and after modification.

In some embodiments, the disclosed methods decrease temperature non-uniformity by greater than or equal to 40%. In some embodiments, the disclosed methods decrease thickness non-uniformity of a deposited film by greater than or equal to 50%. In some embodiments, the temperature reduction at the chucking channel is reduced.

Figure 6:
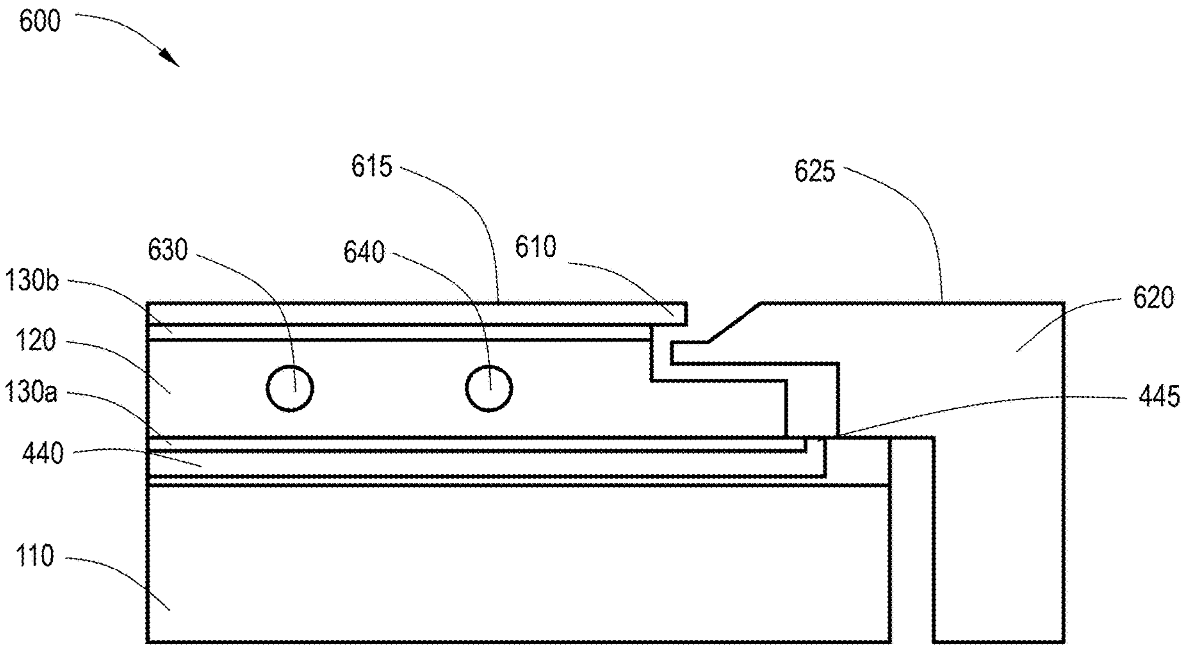
FIG. 6 is an enlarged side view of the peripheral edge of a heater pedestal according to one or more embodiments of the disclosure.

Referring to FIG. 6, one or more embodiment is directed to a modified heater pedestal 600. For the avoidance of doubt, the dimensions of FIG. 6 are not drawn to scale. In some embodiments, the top plate 130 is split to accommodate the heater plate 120. The lower top plate 130*a* contains the vacuum channel (not shown) and an edge purge channel 440 as described above with respect to FIG. 4. The upper top plate 130*b* contains the mesas and the chucking channel (both not shown) as described above with respect to FIGS. 2 and 3. A substrate 610 is supported on the upper top plate 130*b*. In some embodiments, the outlet (not shown) traverses the heater plate 120 from the lower top plate 130*a* containing the vacuum channel to the upper top plate 130*b* containing the chucking channel.

In some embodiments, the modified heater pedestal 600 comprises an edge ring 620. In some embodiments, the edge ring 620 consists essentially of $Al_2O_3$. In some embodiments, the edge ring 620 consists essentially of AlN.

Without being bound by theory, it is believed that if the edge ring composition has a higher thermal conductivity (AlN higher than $Al_2O_3$), then the amount of energy imparted to the purge gas will be higher resulting in a higher temperature purge gas and less edge cooling effect.

In some embodiments, when the top plate 130 is split to accommodate the heater plate 120, as described above, the heater pedestal 600 and edge ring 620 are increased in thickness to accommodate the increase in distance between the lower top plate 130*a* and the upper top plate 130*b*.

In some embodiments, the top outlets 445 of the edge purge channel 440 are oriented vertically. In some embodiments, the vertical orientation of the top outlets 445 increases the residence time of the purge gas near the heater plate 120.

Without being bound by theory, it is believed that one or more of the following factors provides improved temperature non-uniformity. First, the heater plate is closer to the substrate than the vacuum channel 430 and the edge purge channel 440. Accordingly, the temperature drop typically observed as a result of these channels lower. Further, the temperature effect of the channels is more easily counteracted by the heater(s) before affecting the substrate.

Second, the increased thickness between the edge purge channel and the substrate results in an increased flow path distance for the purge gas while proximate to the heater. The resulting temperature increase in the purge gas is believed to have less of a cooling effect on the edge of the substrate.

Figure 7:
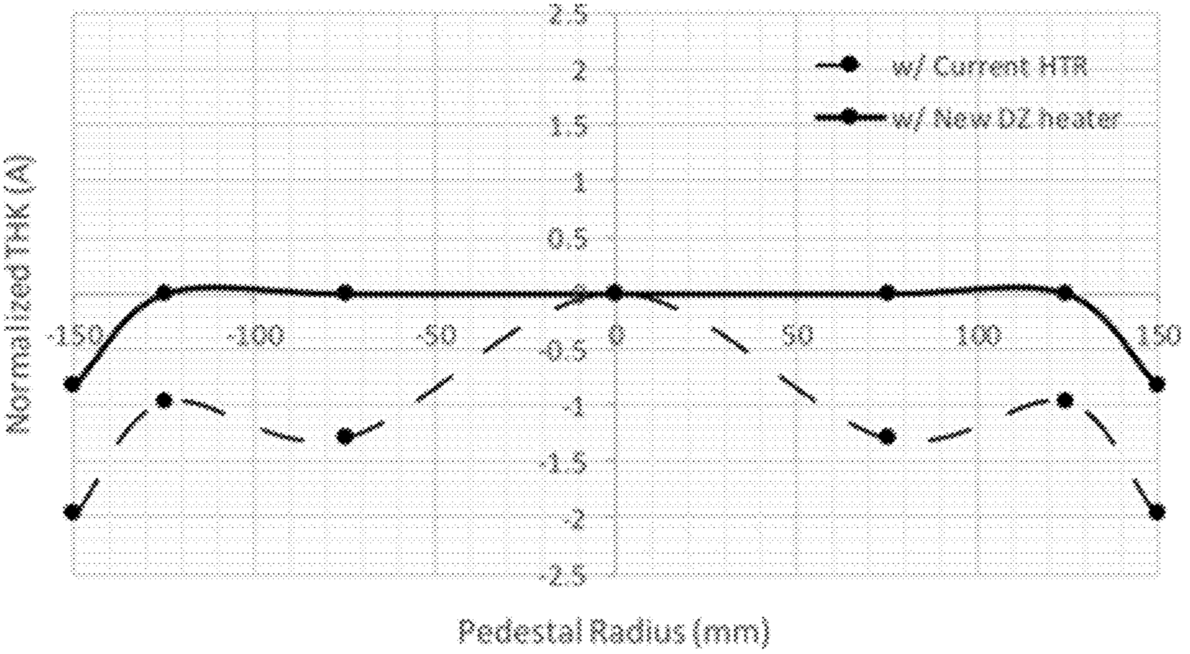
FIG. 7 illustrates simulated deposition thickness profiles before and after modification according to one or more embodiments of the disclosure.

The inventors have surprisingly found that by implementing one or more of these methods, the thickness non-uniformity (3-sigma) of a film deposited on the substrate can be reduced by greater than or equal to 60%. For example, a heater pedestal without modification provides a 3-sigma value of about 3%, but a heater pedestal modified by the disclosed methods provides a 3-sigma value of about 1.2% for thickness non-uniformity. FIG. 7 illustrates simulated deposition thickness profiles before and after modification.

In some embodiments, the disclosed methods decrease thickness non-uniformity of a deposited film by greater than or equal to 60%. In some embodiments, the temperature reduction at the chucking channel is reduced or eliminated.

In some embodiments, the height H of the edge ring 620 is modified. In some embodiments, the height H of the edge ring 620 is decreased so that the top 625 of the edge ring 620 is substantially coplanar with the top surface 615 of the substrate 610. As used in this regard, "substantially coplanar" means that the top of the edge ring 620 and the top surface 615 of the substrate 610 are within +/−5 mil.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A heater pedestal for supporting a substrate during processing, the heater pedestal comprising:

a base plate;

a lower top plate on the base plate, and a heater plate comprising two concentric heaters on the lower top plate, the two concentric heaters including a first heater covering the center of the heater pedestal to a radius of about 135 mm and a second heater covering from a radius of about 135 mm to a peripheral edge of the heater pedestal, the lower top plate containing an edge purge channel extending from near the center of the heater pedestal towards a peripheral edge of the heater pedestal and continuing to a plurality of vertically oriented top outlets and a vacuum channel extending from near the center of the heater pedestal towards and continuing to the plurality of vertically oriented top outlets;

an upper top plate on the heater plate, the upper top plate comprising a recessed chucking channel and a plurality of substrate support mesas in a top surface of the upper top plate; and an edge ring surrounding the periphery of the base plate, the heater plate, and the upper top plate, wherein the edge purge channel and the plurality of vertically oriented top outlets provide a flow path of edge purge gas to an edge of the heater plate surrounded by the edge ring.

2. The heater pedestal of claim 1, wherein the heater plate is closer to the substrate support mesas than the edge purge channel.

3. The heater pedestal of claim 1, wherein the edge ring comprises AIN.

4. The heater pedestal of claim 3, wherein the recessed chucking channel is in fluid communication with at least one outlet from a vacuum channel.

5. The heater pedestal of claim 4, wherein the at least one outlet from the vacuum channel comprises four outlets.

6. The heater pedestal of claim 5, wherein the plurality of vertic e sixteen vertically oriented top outlets.

7. The heater pedestal of claim 6, wherein the heater pedestal comprises four concentric regions of mesas on the upper top plate.

8. The heater pedestal of claim 7, wherein the four concentric regions respectively have an external radius of about 25 mm, 50 mm, 100 mm and 150 mm.

9. The heater pedestal of claim 8, wherein the mesas have a height in range of about 2 mil to about 4 mil.

10. The heater pedestal of claim 9, wherein the chucking channel has depth of 11 mil.

11. The heater pedestal of claim 10, wherein the edge ring has a top surface that is substantially coplanar with a top surface of the substrate on the upper top plate.

* * * * *